United States Patent
Horie

(10) Patent No.: US 6,975,029 B2
(45) Date of Patent: Dec. 13, 2005

(54) ANTENNA-INCORPORATED SEMICONDUCTOR DEVICE

(75) Inventor: Kimito Horie, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 15 days.

(21) Appl. No.: 10/815,806

(22) Filed: Apr. 2, 2004

(65) Prior Publication Data

US 2005/0093130 A1 May 5, 2005

(30) Foreign Application Priority Data

Nov. 4, 2003 (JP) .............................. 2003-374164

(51) Int. Cl.⁷ ............................................. H01L 23/14
(52) U.S. Cl. .................... 257/728; 257/664; 257/666; 257/693; 257/698
(58) Field of Search ................................ 257/664, 666, 257/678, 693, 698, 728

(56) References Cited

U.S. PATENT DOCUMENTS

| | | | |
|---|---|---|---|
| 5,598,032 A * | 1/1997 | Fidalgo ...................... | 257/679 |
| 6,518,885 B1 * | 2/2003 | Brady et al. ............. | 340/572.7 |
| 6,770,955 B1 * | 8/2004 | Coccioli et al. ............ | 257/659 |
| 6,818,985 B1 * | 11/2004 | Coccioli et al. ............ | 257/728 |
| 6,847,275 B2 * | 1/2005 | Sayanagi et al. ........... | 333/247 |

FOREIGN PATENT DOCUMENTS

JP 2001-143039 5/2001

OTHER PUBLICATIONS

Hitachi Metals Technical Journal vol. 17 (2001), "Development of Chip Antennas for Bluetooth Devices" by Hiroyuki Aoyama et al., p. 67 to 72.

* cited by examiner

*Primary Examiner*—Gene M. Munson
(74) *Attorney, Agent, or Firm*—Rabin & Berdo, P.C.

(57) ABSTRACT

Disclosed is an inexpensive semiconductor device which has a built-in antenna capable of efficiently radiating low-power microwaves and has excellent productivity. An IC chip is mounted on a lead frame on which a chip base for mounting an IC chip, an inverted-F antenna and a ground electrode are integrated and is molded with an encapsulating resin. At this time, a gap portion, which is formed between the open end of the resonance portion of the inverted-F antenna and the distal end portion of the ground electrode, is not molded with the encapsulating resin and is left open as a window. This can permit electric waves to be efficiently irradiated from the open end of the antenna exposed to air through the window. As this semiconductor device has nearly the same structure as that of an ordinary semiconductor device, it is excellent in productivity and can be fabricated at a low cost.

6 Claims, 2 Drawing Sheets

ANTENNA-INCORPORATED SEMICONDUCTOR DEVICE

BACKGROUND OF THE INVENTION

1. Field of the Invention

The present invention relates to a semiconductor device with a built-in antenna to be used in a wireless network, such as Zigbee.

2. Description of the Related Art

Zigbee is a new standard for a remote control system which is directed to building/home automation with a low-cost and low-power device which can be used for several years on two size AA batteries. Zigbee uses the 2.4-GHz band radio frequency divided into 16 channels, so that 255 devices can be connected per net work and data can be transferred at a maximum of 250 kbps within 30 meters. While Zigbee has a lower data transfer rate than that in the recent wireless LAN or Bluetooth (trademark registered by Bluetooth SIG Inc.) which uses the same frequency band, it has an advantage such that the power consumption is suppressed considerably lower. In home usage, a network which can radio-control everything with Zigbee from light illumination to a home security system.

As Zigbee puts priority on a low cost as compared with Bluetooth or so, Zigbee demands an inexpensive system with fewer components. Particularly, there is a demand for a semiconductor device on which a high-frequency power circuit including an antenna is mounted on-chip.

Japanese Patent Laid-Open No. 2001-143039 (Document 1) describes a semiconductor device in which an antenna for wire communication formed at one portion of a lead frame and a semiconductor integrated circuit chip (hereinafter called "IC chip") are sealed as an integral unit with an encapsulating resin. The prior art can provide a low-cost semiconductor device which has a non-contact type communication capability and is excellent in productivity.

Hitachi Metals Technical Journal Vol. 17 (2001), "Development of Chip Antennas for Bluetooth Devices" by Hiroyuki Aoyama et al., p. 67 to 72, (Document 2) describes a prototype antenna for Bluetooth devices, in which an improved inverted F antenna is formed of a metal conductor on a dielectric circuit board. The antenna for Bluetooth devices is characterized in that the conductor width is made narrower toward the open end from the ground end of the antenna conductor in order to cover a wider band than the conventional inverted F antenna. Further, a part of the ground conductor extends to near the open end of the antenna conductor and power is supplied to one end of the antenna conductor. Document 2 reported that with the antenna conductor formed on the top surface of dielectric ceramics together with the power supply conductor and ground conductor, the actual measurements on the antenna gain showed the intended performance of the antenna.

As the semiconductor device described in Document 1 has the entire antenna for wireless communication buried in the encapsulating resin or dielectric, however, it can acquire sufficient radiation power only in a relatively low frequency band and cannot be used as a small antenna aiming at ensuring low power consumption particularly in a 2.4-GHz band.

While the antenna for Bluetooth devices described in Document 2 can radiate electric waves efficiently with low power consumption, it is a chip antenna formed on the ceramic board so that the antenna cannot be manufactured at a low cost and with a high productivity.

SUMMARY OF THE INVENTION

Accordingly, it is an object of the invention to provide an inexpensive semiconductor device which has a built-in antenna capable of efficiently radiating low-power microwaves of the band of 2.4 GHz or so and has excellent productivity.

An antenna-incorporated semiconductor device according to the first aspect of the invention comprises a semiconductor integrated circuit chip having a high-frequency power circuit; a lead frame having a ground electrode and an antenna element having one end connected to the ground electrode and an other end open; a wire which connects an input/output electrode of the high-frequency power circuit of the semiconductor integrated circuit chip to a power supply portion of the antenna element; and an encapsulating resin which encapsulating the semiconductor integrated circuit chip, the lead frame and the wire, wherein the open end of the antenna element and the ground electrode facing the open end are exposed through an opening portion provided in a part of the encapsulating resin of the antenna-incorporated semiconductor device.

An antenna-incorporated semiconductor device according to the second aspect of the invention comprises an IC chip, a lead frame, a wire and an encapsulating resin similar to those of the antenna-incorporated semiconductor device according to the first aspect and further includes a coaxial cable connecting connector which is provided in an opening portion provided in a part of the encapsulating resin of the antenna-incorporated semiconductor device and has connection electrodes being the open end of the antenna element and an end portion of said ground electrode.

DETAILED DESCRIPTION OF THE PREFERRED EMBODIMENTS

The object of the invention and other objects and advantages of the invention that are believed to be novel may be more readily understood by reference to the following description of the presently preferred embodiments together with the accompanying drawings. The drawings are however to be considered as illustrative and not restrictive to limit the scope of the invention.

(First Embodiment)

Figure 1A:
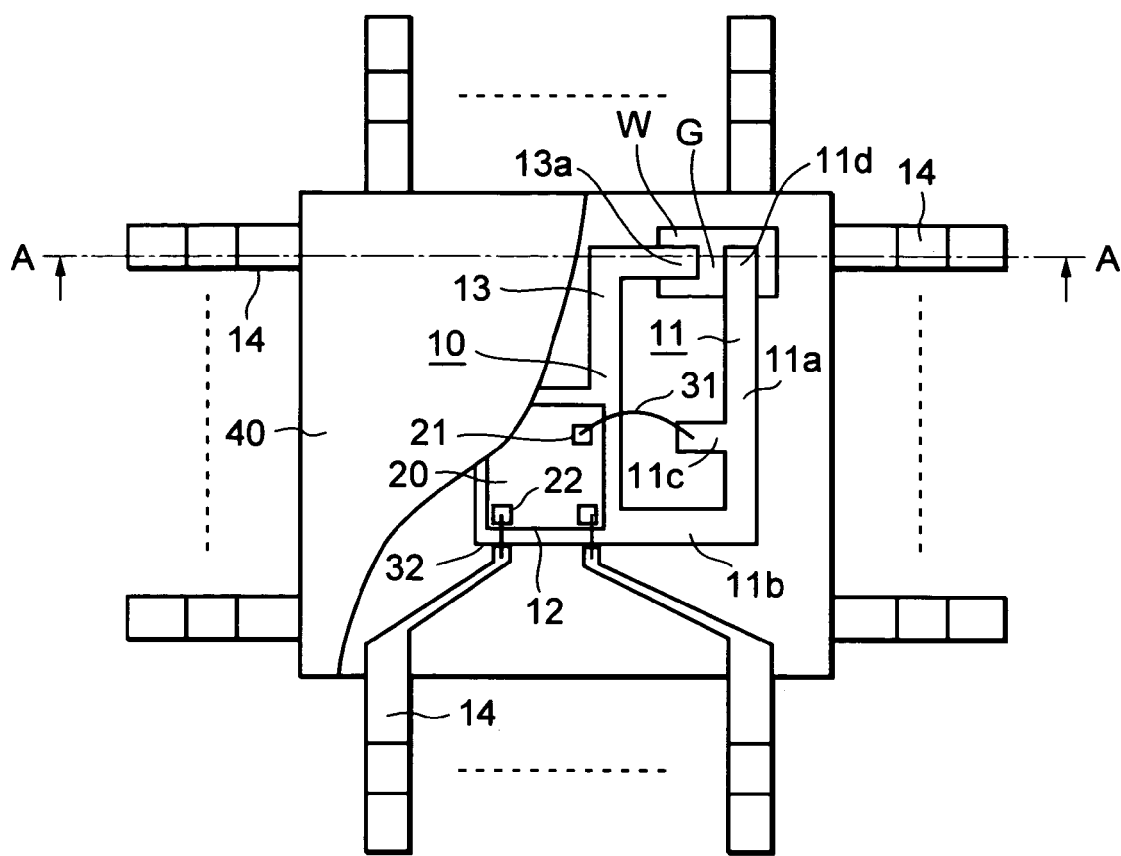
FIGS. 1A and 1B are conceptual diagrams of an antenna-incorporated semiconductor device according to a first embodiment of the invention.
Figure 1B:
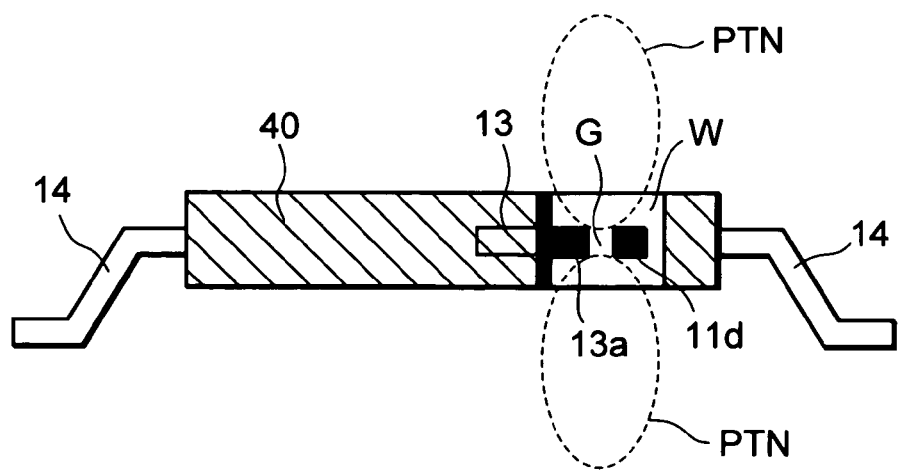

FIGS. 1A and 1B are conceptual diagrams of an antenna-incorporated semiconductor device according to the first embodiment of the invention. FIG. 1A is a plan view showing a part of the semiconductor device cut away to show the internal structure and FIG. 1B is a partly cross-sectional view along line A—A in FIG. 1A.

As shown in FIG. 1A, the antenna-incorporated semiconductor device has a lead frame 10 which is formed by punching an iron plate with a thickness of, for example, 0.5 mm or so by a press machine and has an inverted F antenna 11, a chip base 12, a ground electrode 13 and a plurality of input/output leads 14 formed thereon. The top surface of the lead frame 10 is plated with gold.

The inverted F antenna 11 has a shape of the alphabet "F" inverted by 180° whose vertical long side forms a resonance portion 11a, bottom forms a ground portion 11b and intermediate short horizontal portion forms a power supply portion 11c. The length (resonance length), L, of the resonance portion 11a is equal to $\lambda g/4$ where $\lambda g$ is the wavelength of a high-frequency signal inside the semiconductor device. It is to be noted that the wavelength $\lambda g$ has a relationship of $\lambda g=\lambda 0/\sqrt{\epsilon r}$ with respect to the wavelength $\lambda 0$ in vacuum where $\epsilon r$ is the relative dielectric constant of the dielectric surrounding the inverted F antenna 11 and takes a value of 4 to 5 for 2.4 GHz in case of, for example, an encapsulating resin. Therefore, the resonance length L is 15 mm or so.

The ground portion 11b or the bottom side of the inverted F antenna 11 is connected to the chip base 12 on which an IC chip 20 is to be mounted and is applied with a fixed potential. A distal end portion 13a of the ground electrode 13 connected to the chip base 12 is so arranged as to face a distal end (open end) 11d of the resonance portion 11a of the inverted F antenna 11 with a gap G of a predetermined distance so that a given capacitor Cg is formed between the open end 11d and the ground electrode 13.

The IC chip 20 having a high-frequency power circuit is mounted on the top surface of the chip base 12. The IC chip 20 is connected there by, for example, forming a gold-silicon alloy with the top surface of the chip base 12 by heating. A high-frequency input/output pad 21 on the IC chip 20 mounted on the chip base 12 is connected to the power supply portion 11c of the inverted F antenna 11 by a gold wire 31. The high-frequency input/output pad 21 is used as an input terminal for a high-frequency signal when the inverted F antenna 11 is used for reception. In case where the DC potential of the high-frequency input/output pad 21 of the IC chip 20 does not coincide with the DC potential of the ground electrode 13, a high-frequency signal should be guided to the inverted F antenna 11 via a chip capacitor or a coupling capacitor formed in the IC chip 20 in order to prevent DC short-circuiting. Other input/output pads 22 of the IC chip 20 mounted on the chip base 12 are connected to the respective input/output leads 14 by gold wires 32.

The lead frame 10 connected to the IC chip 20 in the above manner is molded with an encapsulating resin 40 excluding the open end 11d of the inverted F antenna 11, the distal end portion 13a of the ground electrode 13 facing the open end 11d and the gap G between the open end 11d and the distal end portion 13a. That is, as shown in FIG. 1B, the IC chip 20 and the gold wires 31 and 32 for interconnection are all protected by the encapsulating resin 40, excluding the distal end portions of the input/output leads 14 for connection to a printed circuit board, except that the open end 11d of the inverted F antenna 11 and the distal end portion 13a of the ground electrode 13 are exposed to air through a window W provided in a package.

The operation of the antenna-incorporated semiconductor device is described below.

When a high-frequency signal of the 2.4-GHz band is output from the high-frequency input/output pad 21 of the IC chip 20, the high-frequency signal is supplied to the power supply portion 11c of the inverted F antenna 11 via the gold wire 31 to excite the resonance portion 11a. As the ground portion 11b connected to the bottom of the resonance portion 11a extends orthogonal to the resonance portion 11a, the ground portion 11b does not contribute to the resonance length L. Because most of the inverted F antenna 11, excluding the open end 11d, is molded with the encapsulating resin 40, the resonance length L is determined by the relative dielectric constant of the encapsulating resin 40 and the frequency of the high-frequency signal alone without using the effective dielectric constant that takes the portion of the antenna that is exposed to air into consideration.

The high-frequency voltage at the open end 11d becomes higher, generating an intense electric field between the resonance portion 11a excited by the high-frequency signal and the distal end portion 13a of the ground electrode 13. As the open end 11d of the resonance portion 11a and the distal end portion 13a of the ground electrode 13 are exposed to air through the window W provided in the package via the given gap G, those two electrodes are equivalent to a minute dipole antenna as shown in FIG. 1B. Accordingly, the radiation pattern PTN from the window W becomes symmetrical at the cross section perpendicular to the opposing electrode direction. (It is to be noted however that the radiation pattern PTN shown in the diagram is illustrative, not a computed pattern.)

The shape of the inverted F antenna 11 does not contribute to the formation of the radiation pattern PTN. This is because the intense radiation field buried in the encapsulating resin 40 cannot be formed in the air. However, the antenna element of the inverted F antenna 11 itself functions to attenuate signals of frequencies other than the resonance frequency and has the filter capability that cannot be acquired by a minute dipole antenna which merely has the output electrode and the ground electrode arranged to face each other.

As the antenna-incorporated semiconductor device is generally mounted on a printed circuit board, the radiation pattern of electric waves is significantly influenced by the ambient structure. If there is a ground conductor on the printed circuit board on which the antenna-incorporated semiconductor device is mounted, for example, the radiation pattern has only an upward directivity. To provide a non-directional radiation pattern, therefore, it is desirable to design the antenna-incorporated semiconductor device in such a way as not to provide a ground conductor on the printed circuit board underlying the antenna-incorporated semiconductor device.

In short, the antenna-incorporated semiconductor device according to the first embodiment is constructed in such a way that the inverted F antenna 11 is integrated with the lead frame 10, the open end 11d of the inverted F antenna 11 and the distal end portion 13a of the ground electrode 13 are exposed to air through the window W provided in the package and the other portions including the IC chip 20 are molded with the encapsulating resin 40. This structure brings about advantages such that low-power microwaves of the band of 2.4 GHz or so can be radiated efficiently and antenna-incorporated semiconductor devices can be manufactured at a low cost with an excellent productivity. There is another advantage such that because the connection to the antenna by a coaxial cable or so is unnecessary, there is no loss originated from impedance unmatching or so at the point of the connection.

(Second Embodiment)

Figure 2:
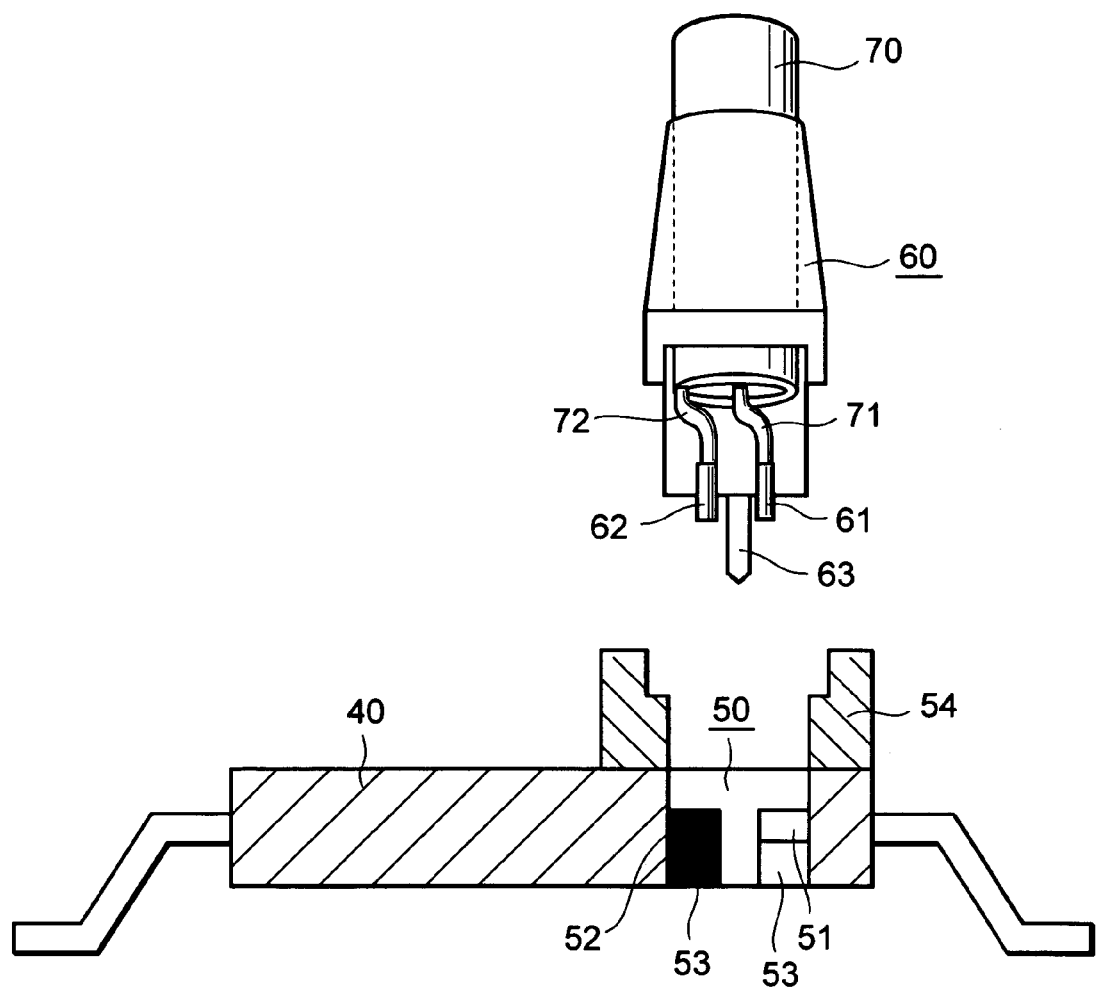
FIG. 2 is an explanatory diagram of an antenna-incorporated semiconductor device according to a second embodiment of the invention.

FIG. 2 is an explanatory diagram of an antenna-incorporated semiconductor device according to the second embodiment of the invention.

This antenna-incorporated semiconductor device has a connector for connection to an external antenna provided at the wave-radiating window portion of an antenna-incorporated semiconductor device which, like the one shown in FIGS. 1A and 2B, has a built-in inverted F antenna. When an antenna-incorporated semiconductor device is mounted on a small device at a high density, for example, electric waves may not be effectively radiated through the window of the antenna-incorporated semiconductor device in some case for the sake of layout convenience. In such a case, the intended effective radiation can be achieved by providing a connector at the window and connecting it to an external antenna by a coaxial cable. This design however should face probable reflection and radiation leakage at the connecting end of the connector or so. The second embodiment relates to a connector which suppresses reflection and radiation leakage at the connecting end.

As shown in FIG. 2, this antenna-incorporated semiconductor device is provided with a female type dielectric connector 50 in place of the wave-radiating window portion of the antenna-incorporated semiconductor device in FIGS. 1A and 1B. That is, the open end of the resonance portion of the inverted F antenna and the ground electrode are formed inside the window as an output electrode 51 and a ground electrode 52, respectively. A dielectric guide 53 is provided inside the window (at the back of the package) in such a way that the window is tightly sealed with the dielectric when a male type dielectric connector 60 is fitted in the female type dielectric connector 50. Further, a guide 54 which holds the male type dielectric connector 60 is provided outside the window (at the top surface of the package).

The male type dielectric connector 60 connects to an external antenna via a coaxial cable 70 and has a coaxial output electrode 61 to which a center conductor 71 of the coaxial cable 70 is to be connected and a coaxial ground electrode 62 to which an external conductor 72 is to be connected. The whole connector including a dielectric guide 63 for positional alignment with the female type dielectric connector 50 is formed of a dielectric. In the diagram, a guide groove to prevent miss-connection of the connector and a mechanism for fixing connection of the connector are not shown.

The method of forming the connector portion of the antenna-incorporated semiconductor device in FIG. 2 is generally classified into two methods. The first method is to form a portion equivalent to a window of another dielectric beforehand and then remove that window portion after completion of the connector portion using a difference in melting point or a chemical property. The second method is to make a window-less package by an ordinary method and then remove only the window portion after completion of the connector portion using a fast water stream or fast stream of particles, so that a hard metal terminal to be an electrode can be left uncut off.

The operation of the antenna-incorporated semiconductor device is discussed below.

First, the male type dielectric connector 60 of the coaxial cable 70 to which an external antenna is connected is fitted into the female type dielectric connector 50 provided in on the antenna-incorporated semiconductor device. As a result, the open end of the resonance portion of the inverted F antenna of the antenna-incorporated semiconductor device is connected to the center conductor 71 of the coaxial cable 70 via the output electrode 51 of the female type dielectric connector 50 and the coaxial output electrode 61 of the male type dielectric connector 60. The distal end portion of the ground electrode of the antenna-incorporated semiconductor device is connected to the external conductor 72 the coaxial cable 70 via the ground electrode 52 of the female type dielectric connector 50 and the coaxial ground electrode 62 of the male type dielectric connector 60. Further, the back of the window of the antenna-incorporated semiconductor device is tightly sealed by the dielectric guide 53 provided at the female type dielectric connector 50 and the dielectric guide 63 of the male type dielectric connector 60 fitted into the dielectric guide 53.

When a high-frequency signal is output from the IC chip of the antenna-incorporated semiconductor device thereafter, the high-frequency signal is output to the female type dielectric connector 50 via a filter formed by the built-in inverted F antenna. Further, the high-frequency signal is supplied to the external antenna via the male type dielectric connector 60 and the coaxial cable 70 and electric waves are radiated in the air.

The antenna-incorporated semiconductor device according to the second embodiment, as described above, is constructed in such a way that the female type dielectric connector 50 is provided at the open end of the built-in inverted F antenna and the connection portion between the female type dielectric connector 50 and the male type dielectric connector 60 provided in on the coaxial cable side are covered with a dielectric tightly. This brings about an advantage such that radiation leakage to the air from the connection portion of the connectors 50 and 60 can be suppressed.

The above-described embodiments have been presented to merely show the technical contents of the invention. The invention should not be considered restrictive to those embodiments, but may be modified in various forms within the scope of the appended claims. The following are some of possible modifications of the invention.

(a) The shape of the inverted F antenna 11 is not limited to the illustrated shape. To provide a wide band characteristic, for instance, the inverted F antenna in use may be designed in such a way that the conductor width becomes narrower toward the open end from the ground end of the antenna conductor as described in Document 2.

(b) The shapes of the dielectric connectors 50 and 60 in FIG. 2 are not limited to those illustrated. The dielectric connectors 50 and 60 may take any structures as long as the dielectric covers around the connection portion of the connectors, thereby suppressing radiation of unnecessary electric waves.

(c) The frequency of the high-frequency signal is not limited to the 2.4-GHz band. Any frequency is allowable as long as the antenna has a size small enough to be built in a semiconductor device.

What is claimed is:

1. An antenna-incorporated semiconductor device comprising:
a semiconductor integrated circuit chip having a high-frequency power circuit;
a lead frame having a ground electrode and an antenna element having one end connected to said ground electrode and an other end open;
a wire which connects an input/output electrode of said high-frequency power circuit of said semiconductor integrated circuit chip to a power supply portion of said antenna element; and
an encapsulating resin encapsulating said semiconductor integrated circuit chip, said lead frame and said wire, wherein said open end of said antenna element and said ground electrode facing said open end are exposed through an opening portion provided in a part of said encapsulating resin of said antenna-incorporated semiconductor device.

2. The antenna-incorporated semiconductor device according to claim 1, wherein said antenna element is an inverted-F antenna.

3. The antenna-incorporated semiconductor device according to claim 1, wherein said input/output electrode of said high-frequency power circuit of said semiconductor integrated circuit chip is connected to said power supply portion of said antenna element via a coupling capacitor.

4. An antenna-incorporated semiconductor device comprising:
- a semiconductor integrated circuit chip having a high-frequency power circuit;
- a lead frame having a ground electrode and an antenna element having one end connected to said ground electrode and an other end open;
- a wire which connects an input/output electrode of said high-frequency power circuit of said semiconductor integrated circuit chip to a power supply portion of said antenna element;
- an encapsulating resin encapsulating said semiconductor integrated circuit chip, said lead frame and said wire; and
- a coaxial cable connecting connector which is provided in an opening portion provided in a part of said encapsulating resin of said antenna-incorporated semiconductor device and has connection electrodes being said open end of said antenna element and an end portion of said ground electrode.

5. The antenna-incorporated semiconductor device according to claim 4, wherein said connector is a female type and has a back side covered with a dielectric.

6. The antenna-incorporated semiconductor device according to claim 4, wherein said connector is a female type and a dielectric guide for positional alignment of a male connector on a coaxial cable side with a back side of said capacitor and burying a gap therebetween.

* * * * *